US012585408B2

(12) United States Patent
Sforzin

(10) Patent No.: US 12,585,408 B2
(45) Date of Patent: Mar. 24, 2026

(54) ERROR CONTROL IN MEMORY SYSTEMS USING COMBINATIONAL CIRCUITS

(71) Applicant: Micron Technology, Inc., Boise, ID (US)

(72) Inventor: Marco Sforzin, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/816,941

(22) Filed: Aug. 27, 2024

(65) Prior Publication Data

US 2026/0064308 A1 Mar. 5, 2026

(51) Int. Cl.
 *G06F 3/06* (2006.01)

(52) U.S. Cl.
 CPC .......... *G06F 3/0655* (2013.01); *G06F 3/0619* (2013.01); *G06F 3/0679* (2013.01)

(58) Field of Classification Search
 CPC ..... G06F 3/0655; G06F 3/0679; G06F 3/0619
 See application file for complete search history.

(56) References Cited

U.S. PATENT DOCUMENTS

| | | | | |
|---|---|---|---|---|
| 8,332,731 B1* | 12/2012 | Sforzin | ............... | H03M 13/152 |
| | | | | 714/782 |
| 8,576,096 B2* | 11/2013 | Mittal | ..................... | H03M 7/30 |
| | | | | 341/51 |
| 2003/0063554 A1* | 4/2003 | Morioka | ........... | H03M 13/1525 |
| | | | | 370/200 |
| 2014/0195881 A1* | 7/2014 | Srivastava | .......... | H03M 13/151 |
| | | | | 714/782 |
| 2016/0291898 A1* | 10/2016 | Beitler | .................. | G06F 3/0643 |
| 2021/0399744 A1* | 12/2021 | Kwok | ................. | H03M 13/255 |
| 2024/0184669 A1* | 6/2024 | Jang | .................. | H03M 13/3738 |

* cited by examiner

*Primary Examiner* — Mark A Giardino, Jr.
(74) *Attorney, Agent, or Firm* — Harrity & Harrity, LLP

(57) ABSTRACT

In some implementations, a memory system may obtain, from a host system, a command to read data. The memory system may retrieve a codeword associated with the data. The memory system may generate, based on the codeword, a syndrome. The memory system may generate one or more decoding values based on the syndrome and using one or more combinational circuits. The memory system may correct one or more errors in the codeword using the one or more decoding values. The memory system may provide the data to the host system.

25 Claims, 9 Drawing Sheets

300

ERROR CONTROL IN MEMORY SYSTEMS USING COMBINATIONAL CIRCUITS

TECHNICAL FIELD

The present disclosure generally relates to memory devices, memory device operations, and, for example, to error control in memory systems using combinational circuits.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
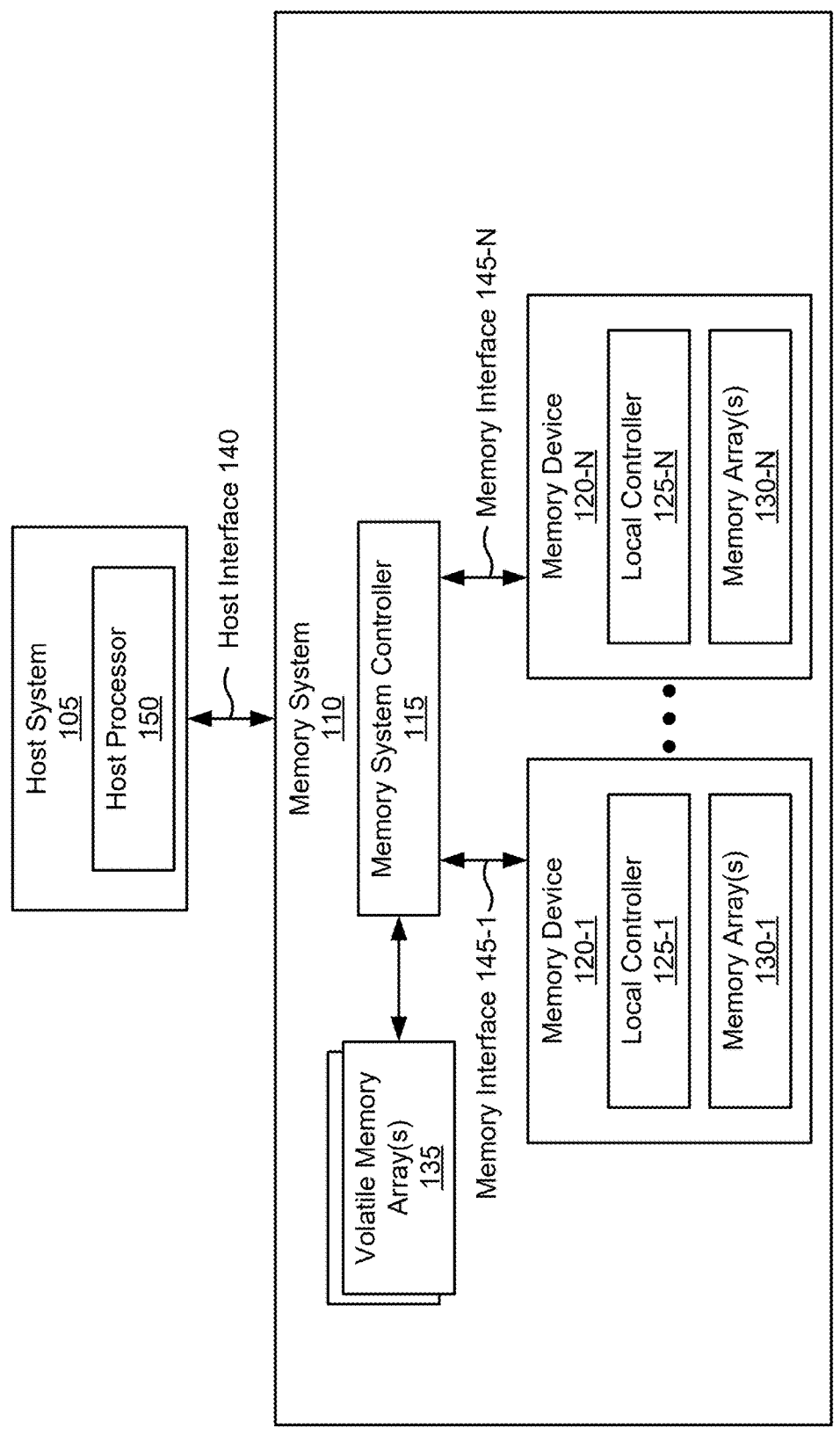
FIG. 1 is a diagram illustrating an example system capable of error control in memory systems using combinational circuits.

Memory systems may use multiple data protection mechanisms, such as chipkill (CK) schemes in which data and parity information associated with the data may be stored across multiple locations (e.g., stored across multiple blocks, multiple planes, and/or multiple memory dies), as well as non-chipkill (NOCK) schemes in which data and parity information may be stored to a continuous range of addresses (e.g., a continuous range of physical addresses and/or a continuous range of logical addresses). In some cases, NOCK schemes may include error control operations capable of correcting up to two errors in a unit of data. For example, a memory system may communicate data (e.g., may obtain data from a host system, may write data, and may read data) as one or more data packets, in which each data packet includes 64 symbols. As described herein a symbol refers to an 8-bit sequence of data (e.g., a byte). However, techniques described herein may apply to symbols of other sizes. A NOCK error control scheme for such a memory system may support correcting up to two symbols in the data packet (e.g., the error control scheme may use a double symbol correcting (DSC) code).

Some memory systems may implement such DSC codes using iterative logic. For example, to correct one or more errors in a data packet, a memory system may identify an error locator polynomial and iteratively identify one or more roots of the error locator polynomial. The memory system may then use the one or more roots to identify one or more error values using an error evaluator polynomial. However, such an iterative algorithm may implement one or more sequential circuits. As described herein, a sequential circuit is a circuit having an output that, for a given time, is dependent on one or more inputs at the given time, as well as previous inputs to the circuit (e.g., the output of the circuit may depend on inputs prior to the given time). Thus, such iterative algorithms may be resource intensive (e.g., may use a large amount of processing resources and/or energy resources), and may use relatively complicated processing circuitry, which may reduce the performance of the memory system, may increase the power consumption of the memory system, and/or may limit the accuracy of error correction schemes.

Some implementations described herein enable error control in memory systems using combinational logic. For example, to encode a data packet according to a DSC error correction scheme, the memory system may generate parity information for the data packet using a first one or more combinational circuits. As described herein, a combinational circuit is a circuit having an output that, for a given time, is dependent on one or more inputs at the given time, regardless of previous inputs to the circuit (e.g., regardless of inputs prior to the given time). For example, a combinational circuit may include one or more adder circuits configured to obtain a set of inputs and output the sum of the inputs, one or more subtractor circuits configured to obtain a set of inputs and output a difference of the inputs, one or more exclusive-or (XOR) circuits to obtain a set of inputs and output the result of an XOR operation of the inputs, one or more multiplexers, and/or one or more demultiplexers, among other examples. Because the output of a combinational circuit depends on current inputs, rather than a combination of current and previous inputs, the performance of combinational circuits may be greater than other types of circuits, such as sequential circuits in which an output depends on both the current inputs and previous inputs. For example, a sequence of combinational circuits may obtain one or more inputs and generate one or more outputs in a reduced quantity of clock cycles (e.g., a single clock cycle), as compared with a sequence of sequential circuits.

To decode the data packet according to the DSC error correction scheme, the memory system may generate one or more syndrome values using a second one or more combinational circuits. The memory system may provide the one or more syndrome values to a third one or more combinational circuits to generate one or more decoding values. The one or more decoding values may indicate information associated with one or more errors in the data packet. For example, the memory system may provide a first subset of the one or more decoding values to a fourth one or more combinational circuits to generate one or more error position values. The memory system may provide a second subset of the one or more decoding values to a fifth one or more combinational circuits to generate one or more error values. The memory system may use the one or more error values to correct one or more errors in the data packet.

As a result, by enabling error control in memory systems using combinational logic, the memory system may enable encoding and/or decoding a data packet using the DSC error correction scheme. For example, by encoding a data packet using one or more combinational circuits, the memory system may enable generating parity information for the DSC error scheme while reducing reliance on sequential circuits. Additionally, by generating the decoding values using one or more combinational circuits, the memory system may enable decoding the data packet while reducing reliance on sequential circuits. Said another way, the one or more combinational circuits may enable a fully-algebraic implementation of the DSC error correction scheme. Such an implementation may improve the performance of encoding and/or decoding a data packet, such as by reducing the quantity of resources (e.g., processing resources and/or energy resources) used to encode and/or decode the data packet, may increase the speed at which the data packet is encoded and/or decoded, and may reduce the complexity of processing circuitry used to encode and/or decode the data packet.

FIG. 1 is a diagram illustrating an example system 100 capable of error control in memory systems using combinational circuits. The system 100 may include one or more devices, apparatuses, and/or components for performing operations described herein. For example, the system 100 may include a host system 105 and a memory system 110. The memory system 110 may include a memory system controller 115 and one or more memory devices 120, shown as memory devices 120-1 through 120-N (where N≥1). A memory device may include a local controller 125 and one or more memory arrays 130. The host system 105 may communicate with the memory system 110 (e.g., the memory system controller 115 of the memory system 110) via a host interface 140. The memory system controller 115 and the memory devices 120 may communicate via respective memory interfaces 145, shown as memory interfaces 145-1 through 145-N (where N≥1).

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host system 105 may include a host processor 150. The host processor 150 may include one or more processors configured to execute instructions and store data in the memory system 110. For example, the host processor 150 may include a central processing unit (CPU), a graphics processing unit (GPU), a field-programmable gate array (FPGA), an application-specific integrated circuit (ASIC), and/or another type of processing component.

The memory system 110 may be any electronic device or apparatus configured to store data in memory. For example, the memory system 110 may be a hard drive, a solid-state drive (SSD), a flash memory system (e.g., a NAND flash memory system or a NOR flash memory system), a universal serial bus (USB) drive, a memory card (e.g., a secure digital (SD) card), a secondary storage device, a non-volatile memory express (NVMe) device, an embedded multimedia card (eMMC) device, a dual in-line memory module (DIMM), and/or a random-access memory (RAM) device, such as a dynamic RAM (DRAM) device or a static RAM (SRAM) device.

The memory system controller 115 may be any device configured to control operations of the memory system 110 and/or operations of the memory devices 120. For example, the memory system controller 115 may include control logic, a memory controller, a system controller, an ASIC, an FPGA, a processor, a microcontroller, and/or one or more processing components. In some implementations, the memory system controller 115 may communicate with the host system 105 and may instruct one or more memory devices 120 regarding memory operations to be performed by those one or more memory devices 120 based on one or more instructions from the host system 105. For example, the memory system controller 115 may provide instructions to a local controller 125 regarding memory operations to be performed by the local controller 125 in connection with a corresponding memory device 120.

A memory device 120 may include a local controller 125 and one or more memory arrays 130. In some implementations, a memory device 120 includes a single memory array 130. In some implementations, each memory device 120 of the memory system 110 may be implemented in a separate semiconductor package or on a separate die that includes a respective local controller 125 and a respective memory array 130 of that memory device 120. The memory system 110 may include multiple memory devices 120.

A local controller 125 may be any device configured to control memory operations of a memory device 120 within which the local controller 125 is included (e.g., and not to control memory operations of other memory devices 120). For example, the local controller 125 may include control logic, a memory controller, a system controller, an ASIC, an FPGA, a processor, a microcontroller, and/or one or more processing components. In some implementations, the local controller 125 may communicate with the memory system controller 115 and may control operations performed on a memory array 130 coupled with the local controller 125 based on one or more instructions from the memory system controller 115. As an example, the memory system controller 115 may be an SSD controller, and the local controller 125 may be a NAND controller.

A memory array 130 may include an array of memory cells configured to store data. For example, a memory array 130 may include a non-volatile memory array (e.g., a NAND memory array or a NOR memory array) or a volatile memory array (e.g., an SRAM array or a DRAM array). In some implementations, the memory system 110 may include one or more volatile memory arrays 135. A volatile memory array 135 may include an SRAM array and/or a DRAM array, among other examples. The one or more volatile memory arrays 135 may be included in the memory system controller 115, in one or more memory devices 120, and/or in both the memory system controller 115 and one or more memory devices 120. In some implementations, the memory system 110 may include both non-volatile memory capable of maintaining stored data after the memory system 110 is powered off and volatile memory (e.g., a volatile memory array 135) that requires power to maintain stored data and that loses stored data after the memory system 110 is powered off. For example, a volatile memory array 135 may cache data read from or to be written to non-volatile memory, and/or may cache instructions to be executed by a controller of the memory system 110.

The host interface 140 enables communication between the host system 105 (e.g., the host processor 150) and the memory system 110 (e.g., the memory system controller 115). The host interface 140 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, an eMMC interface, a double data rate (DDR) interface, and/or a DIMM interface.

The memory interface 145 enables communication between the memory system 110 and the memory device 120. The memory interface 145 may include a non-volatile memory interface (e.g., for communicating with non-volatile memory), such as a NAND interface or a NOR interface. Additionally, or alternatively, the memory interface 145 may include a volatile memory interface (e.g., for communicating with volatile memory), such as a DDR interface.

Although the example memory system 110 described above includes a memory system controller 115, in some implementations, the memory system 110 does not include a memory system controller 115. For example, an external controller (e.g., included in the host system 105) and/or one or more local controllers 125 included in one or more corresponding memory devices 120 may perform the operations described herein as being performed by the memory system controller 115. Furthermore, as used herein, a "controller" may refer to the memory system controller 115, a local controller 125, or an external controller. In some implementations, a set of operations described herein as being performed by a controller may be performed by a single controller. For example, the entire set of operations may be performed by a single memory system controller 115, a single local controller 125, or a single external controller. Alternatively, a set of operations described herein as being performed by a controller may be performed by more than one controller. For example, a first subset of the operations may be performed by the memory system controller 115 and a second subset of the operations may be performed by a local controller 125. Furthermore, the term "memory apparatus" may refer to the memory system 110 or a memory device 120, depending on the context.

A controller (e.g., the memory system controller 115, a local controller 125, or an external controller) may control operations performed on memory (e.g., a memory array 130), such as by executing one or more instructions. For example, the memory system 110 and/or a memory device 120 may store one or more instructions in memory as firmware, and the controller may execute those one or more instructions. Additionally, or alternatively, the controller may receive one or more instructions from the host system 105 and/or from the memory system controller 115, and may execute those one or more instructions. In some implementations, a non-transitory computer-readable medium (e.g., volatile memory and/or non-volatile memory) may store a set of instructions (e.g., one or more instructions or code) for execution by the controller. The controller may execute the set of instructions to perform one or more operations or methods described herein. In some implementations, execution of the set of instructions, by the controller, causes the controller, the memory system 110, and/or a memory device 120 to perform one or more operations or methods described herein. In some implementations, hardwired circuitry is used instead of or in combination with the one or more instructions to perform one or more operations or methods described herein. Additionally, or alternatively, the controller may be configured to perform one or more operations or methods described herein. An instruction is sometimes called a "command."

For example, the controller (e.g., the memory system controller 115, a local controller 125, or an external controller) may transmit signals to and/or receive signals from memory (e.g., one or more memory arrays 130) based on the one or more instructions, such as to transfer data to (e.g., write or program), to transfer data from (e.g., read), to erase, and/or to refresh all or a portion of the memory (e.g., one or more memory cells, pages, sub-blocks, blocks, or planes of the memory). Additionally, or alternatively, the controller may be configured to control access to the memory and/or to provide a translation layer between the host system 105 and the memory (e.g., for mapping logical addresses to physical addresses of a memory array 130). In some implementations, the controller may translate a host interface command (e.g., a command received from the host system 105) into a memory interface command (e.g., a command for performing an operation on a memory array 130).

In some implementations, one or more systems, devices, apparatuses, components, and/or controllers of FIG. 1 may include: a syndrome generator configured to generate a syndrome based on a codeword; a decoding value generator coupled to the syndrome generator, the decoding value generator configured to generate one or more decoding values based on the syndrome and using one or more combinational circuits; and an error value generator configured to generate an error value associated with the codeword based on the one or more decoding values.

In some implementations, one or more systems, devices, apparatuses, components, and/or controllers of FIG. 1 may be configured to: obtain, from a host system, a command to read data; retrieve a codeword associated with the data; generate, based on the codeword, a syndrome; generate one or more decoding values based on the syndrome and using one or more combinational circuits; correct one or more errors in the codeword using the one or more decoding values; and provide the data to the host system.

In some implementations, one or more systems, devices, apparatuses, components, and/or controllers of FIG. 1 may be configured to: obtain, from a host system, a command to read data; retrieve a codeword associated with the data; generate, at a syndrome generator and based on the codeword, a syndrome; generate, at a decoding value generator, one or more decoding values based on the syndrome and using one or more combinational circuits; correct one or more errors in the codeword using the one or more decoding values; and provide the data to the host system.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more operations described as being performed by another set of components shown in FIG. 1.

Figure 2:
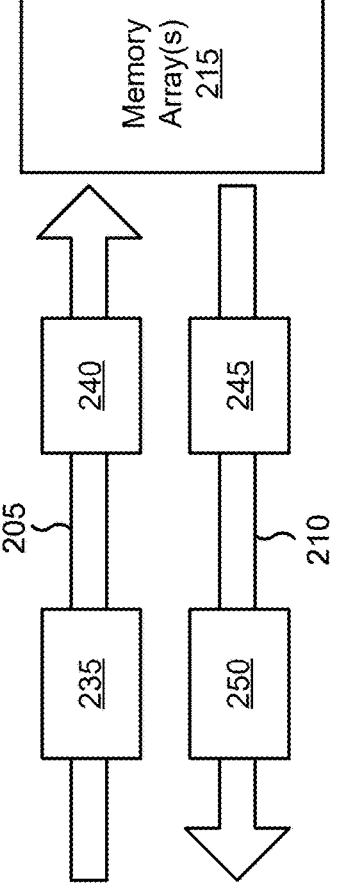
FIG. 2 is a diagram illustrating an example of a system capable of error control in memory systems using combinational circuits.
Figure 2:
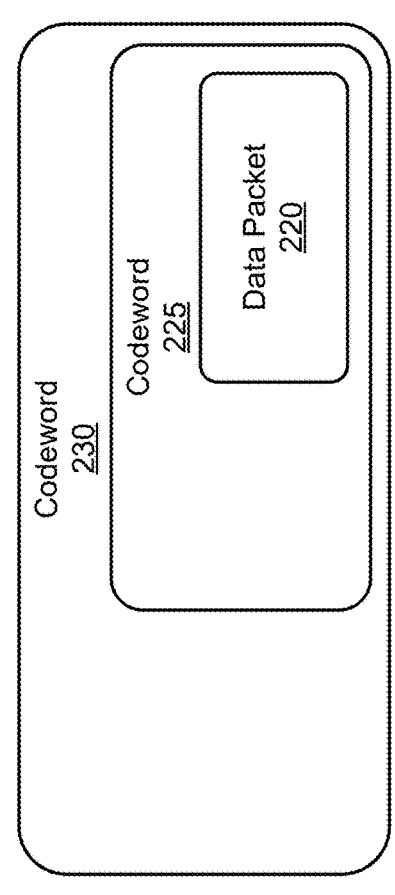

FIG. 2 is a diagram illustrating an example of a system 200 capable of error control in memory systems using combinational circuits. The system 200 may include one or more data paths, such as a write data path 205 and a read data path 210 of one or more devices, apparatuses, and/or components for performing operations described herein. For example, the memory system may store data to one or more memory arrays 215 (e.g., memory arrays 130) via the write data path 205. Further, the memory system may retrieve data from the one or more memory arrays 215 via the read data path 210. In some implementations, the system 200 may be implemented in a compute express link (CXL) system. For example, the system 200 may be implemented within a memory system (e.g., the memory system 110) that includes a CXL controller and one or more memory devices 120.

The memory system may implement one or more data protection schemes to increase the reliability of data stored to the one or more memory arrays 215. For example, as part of storing a data packet 220 to the one or more memory arrays 215, the memory system may generate one or more codewords, such as a codeword 225 and a codeword 230, using respective data protection schemes. The data packet 220 may include data obtained from a host system (e.g., the host system 105), and may be organized into one or more symbols. In some implementations, a data packet 220 may include a given quantity of symbols, such as 64 symbols, and a symbol may include a given quantity of data, such as eight bits. Accordingly, a data packet 220 may include 64 bytes.

In some examples, the memory system may obtain, from the host system, a command to store a data packet 220 to the one or more memory arrays 215 (e.g., a write command). To store a data packet 220, the memory system may generate a codeword 225 using an encoder 235. The encoder 235 may be configured to calculate first parity information using the data packet 220. The encoder 235 may combine the first parity information with the data packet 220 to generate the codeword 225, such as by appending the first parity information to the data packet 220. In some implementations, the first parity information may be cyclic redundancy check (CRC) value. The first parity information may include a given quantity of data, such as 32 bits (e.g., four symbols). Accordingly, the codeword 225 may include 68 symbols (e.g., 68 bytes). Additionally, the memory system may generate a codeword 230 using an encoder 240. The encoder 240 may be configured to calculate second parity information using the data packet 220 and using one or more combinational circuits, as described in greater detail in connection to FIG. 4. The encoder 240 may combine the second parity information with the codeword 225 to generate the codeword 230, such as by appending the second parity information to the codeword 230.

The second parity information may be configured to correct up to two corrupted symbols in the data packet 220 and/or the codeword 225. As described herein, a corrupted symbol is a symbol in which one or more bits of the symbol have changed value (e.g., changed value while being stored to the one or more memory arrays 215 and/or while being read from the one or more memory arrays 215). "A corrupted symbol" in data and "an error" in data may be used interchangeably. For example, the encoder 240 may generate the second parity information using one or more single symbol correction (SSC) schemes, as described in greater detail in connection to FIG. 3. Alternatively, the encoder 240 may generate the second parity information using a DSC scheme, as described in greater detail in connection with FIG. 4. The second parity information may include a given quantity data, such as 32 bits (e.g., four symbols). Accordingly, the codeword 230 may include 72 symbols (e.g., 72 bytes). Symbols of the codeword 230 may be ordered. For example, each symbol of the codeword 230 may have a respective position, such as a symbol index. Said another way, the codeword 230 may be represented as a vector y of symbols $y_i$, where $i \in \{0, 1, 2 \ldots 71\}$. In such a representation, the symbol $y_i$ is the $i^{th}$ symbol of the codeword 230 (e.g., the symbol $y_i$ is in the $i^{th}$ position of the codeword 230).

In some examples, the memory system may obtain, from the host system, a command to read the data packet 220 from the one or more memory arrays 215 (e.g., a read command). To read the data packet 220, the memory system may retrieve the codeword 230 from the one or more memory arrays 215. The memory system may decode the codeword 230 to correct and/or detect one or more errors in the codeword 225 using a decoder 245. As described in greater detail in connection to FIG. 5, to decode the codeword 230, the memory system may calculate a syndrome (e.g., one or more values that indicate information associated with the one or more errors in the codeword 225). Using the syndrome, the memory system may attempt to detect one or more errors in the codeword 225. If the memory system detects no errors in the codeword 225, the memory system may issue the codeword 225 to the next stage of the read data path 210 (e.g., to a decoder 250). Alternatively, if the memory system detects one or more correctable errors in the codeword 225, then the memory system may correct the one or more correctable errors using one or more combinational circuits. Subsequently, the memory system may issue the codeword 225 to the next stage of the read data path 210. The memory system may decode the codeword 225 to correct and/or detect one or more errors in the data packet 220 using the decoder 250. For example, the memory system may perform a CRC operation to detect and/or correct the one or more errors in the data packet. The memory system may thus provide the corrected data packet 220 to the host system. In some examples, such as if the memory system detected one or more uncorrectable errors, the memory system may provide a message to the host indicating that the data packet includes the one or more uncorrectable errors.

By encoding a codeword 225 using the encoder 240, the system 200 may enable generating parity information for the DSC error scheme using one or more combinational circuits. Such an implementation may improve the performance of encoding the codeword 225, such as by reducing the quantity of resources (e.g., processing resources and/or energy resources) used to encode the codeword 225, by increasing the speed at which the encoder 240 encodes the codeword 225, and reducing the complexity of processing circuitry used to encode the codeword 225.

Further, by decoding a codeword 230 using the decoder 245, the system 200 may enable the DSC error scheme using one or more combinational circuits. Such an implementation may improve the performance of decoding the codeword 230, such as by reducing the quantity of resources (e.g., processing resources and/or energy resources) used to decode the codeword 230, by increasing the speed at which the decoder 245 decodes the codeword 230, and reducing the complexity of processing circuitry used to decode the codeword 230.

As indicated above, FIG. 2 is provided as an example. Other examples may differ from what is described with regard to FIG. 2.

Figure 3:
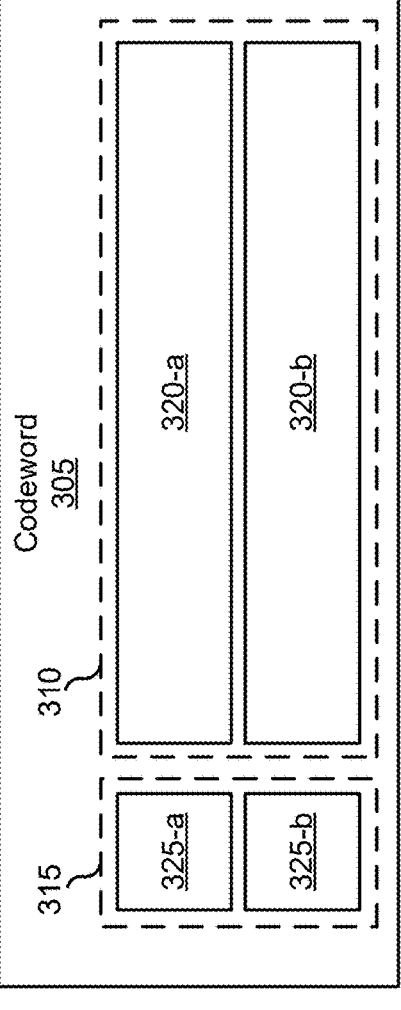
FIG. 3 is a diagram illustrating an example of a data structure capable of error control in memory systems using combinational circuits.

FIG. 3 is a diagram illustrating an example of a data structure 300 capable of error control in memory systems using combinational circuits. A memory apparatus, such as the memory system 110, may manage the data structure 300. The data structure 300 may include a codeword 305, which may be an example of a codeword 230. For example, the codeword 305 may include a payload 310, which may include a data packet 220 and/or a codeword 225.

The codeword 305 may include parity information 315 configured to correct multiple corrupted symbols in the payload 310. For example, the codeword 305 may be generated by an encoder, such as the encoder 240. The parity information 315 may be generated using one or more error correction schemes that are each configured to correct a respective error in the payload 310, such as one or more SSC schemes. To enable correcting multiple errors, the memory system may partition the payload 310 into multiple portions 320, such as the portion 320-a and the portion 320-b. The memory system may generate portions 325 of the parity information 315, such as a portion 325-a and a portion 325-b, using the corresponding portions 320-a and 320-b of the payload 310. For example, the memory system may generate the portion 325-a of the parity information 315 by applying a first error correction scheme to the portion 320-a of the payload 310 and may generate the portion 325-b of the parity information 315 by applying a second error correction scheme to the portion 320-b of the payload 310. Each portion 325 of the parity information 315 may be configured to correct a single error in the corresponding portion 320 of the payload 310. For example, the portion 325-a of the parity information 315 and the portion 325-b of the parity information may each be a respective SSC code. Accordingly, by arranging the payload 310 into multiple (e.g., two) portions 320, the data structure 300 may enable correcting up to two errors in the payload 310.

In some examples, the memory system may configure the portions 320 to mitigate the likelihood of multiple errors occurring in a single portion 320. For example, the memory system may configure the portions 320 such that symbols stored to consecutive portions of the memory system, such as symbols stored to neighboring portions of a word line and/or symbols stored to neighboring word lines, are arranged in different portions 320 of the payload 310. Accordingly, in the event of an error which corrupts a word line and/or neighboring word lines, the memory system may mitigate the likelihood of multiple symbols in the same portion 320 being corrupted.

As indicated above, FIG. 3 is provided as an example. Other examples may differ from what is described with regard to FIG. 3.

Figure 4:
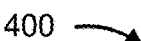
FIG. 4 is a diagram illustrating an example of an encoder capable of error control in memory systems using combinational circuits.
Figure 4:
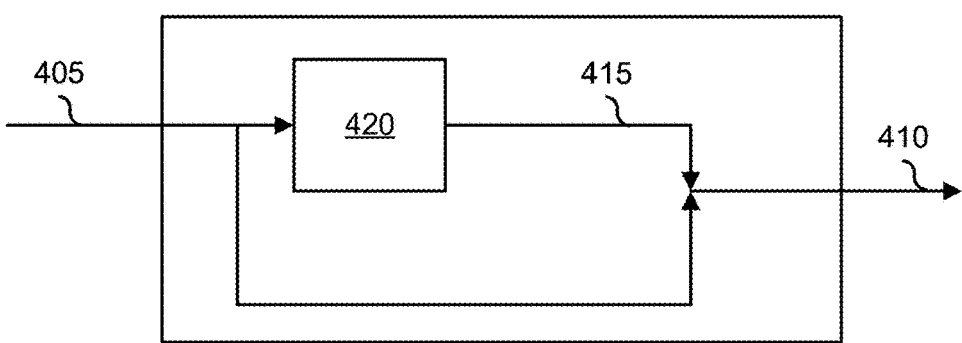

FIG. 4 is a diagram illustrating an example of an encoder 400 capable of error control in memory systems using combinational circuits. The encoder 400 may be implemented in a data path of a memory system, such as the write data path 205 of the memory system 110. The encoder 400 may be configured to encode a payload 405, such as a data packet 220 and/or a codeword 225, into a codeword 410 having parity information 415 capable of correcting up to two errors. For example, the encoder 400 may be an example of the encoder 240.

The encoder 400 may encode the payload 405 using one or more combinational circuits in accordance with a DSC error correction scheme, such as a Reed-Solomon scheme (e.g., the parity information 415 may be a Reed-Solomon code). In accordance with the DSC error correction scheme, symbols of the payload 405 and/or the parity information 415 may be represented as elements of an algebraic field, such as a finite field (e.g., a Galois field). As described herein, an algebraic field is a set of elements on which operations including addition, subtraction, multiplication, and division are defined and satisfy one or more field rules. A finite field, which may also be called a Galois field, is a field having a finite quantity of elements. Finite fields may be defined, in part, by the quantity of elements included in the field. For example, a finite field having two elements may be referred to as the GF(2) field, a finite field having four elements may be referred to as the GF(4) field and/or the GF(22) field, and so on. Thus, because symbols of the payload 405 and/or the parity information 415 may include eight bits, each possible symbol may be represented as a respective element of the GF(28) field.

The encoder 400 may operate on such symbols according to the arithmetic (e.g., the one or more field rules) of the GF(28) field. For example, the encoder 400 may perform operations between element of the GF(28) field, such as addition, subtraction, multiplication, and/or division, such that the result of an operation is an element of the GF(28) field (e.g., using modulo (mod) arithmetic). Each non-zero element of a finite field may be written in terms of a primitive element $\alpha$. For example, each non-zero element of a finite field may be written as a', where i is a natural number. Additionally, or alternatively, elements of a finite field may be represented as polynomials, and each element of the field may be written as a generator polynomial raised to a power. For example, the GF(28) field may have a generator polynomial $p(x)=x^8+x^4+x^3+x^{2=1}$.

To generate the parity information 415, the encoder 400 may use a DSC code having a generator polynomial $g(x)=x^4+\alpha^{76}\times^3+251\times2+\alpha^{81}x+\alpha^{10}$. The encoder 400 may, using the one or more combinational circuits, multiply the payload 405 by a parity matrix 420. The parity matrix 420 may be defined as PT, as shown in equation 1 below, where $r_i(x)=x^{N-K+i}$ mod g (x), N is the quantity of symbols in the codeword 410 (e.g., 72 symbols), and K is the quantity of symbols in the codeword 505 (e.g., 68 symbols). In equation 1, each element r; (x) is an element of the algebraic field represented as a polynomial (e.g., a polynomial function taking x as an independent variable).

$$P^T = \begin{bmatrix} -r_0 x \\ -r_1(x) \\ \cdots \\ -r_{K-1}(x) \end{bmatrix} \tag{1}$$

For example, if the payload 405 and the parity information 415 are denoted as vectors d and p of symbols, respectively, then the parity information 415 may be obtain as shown in equation 2.

$$p=dP^T \tag{2}$$

To enable multiplication of the payload 405 by the parity matrix 420, the parity matrix 420 may be encoded as a matrix of symbols (e.g., may be encoded in a binary representation). After generating the parity information 415, the encoder 400 may combine the payload 405 and the parity information 415 (e.g., by appending the parity information 415 to the payload 405) to generate the codeword 410.

By encoding a payload 405 using the parity matrix 420, the encoder 400 may enable generating parity information for the DSC error scheme using one or more combinational circuits. Such an implementation may improve the performance of encoding the payload 405, such as by reducing the quantity of resources (e.g., processing resources and/or energy resources) used to encode the payload 405, by increasing the speed at which the encoder 400 encodes the payload 405, and reducing the complexity of processing circuitry used to encode the payload 405.

As indicated above, FIG. 4 is provided as an example. Other examples may differ from what is described with regard to FIG. 4.

Figure 5:
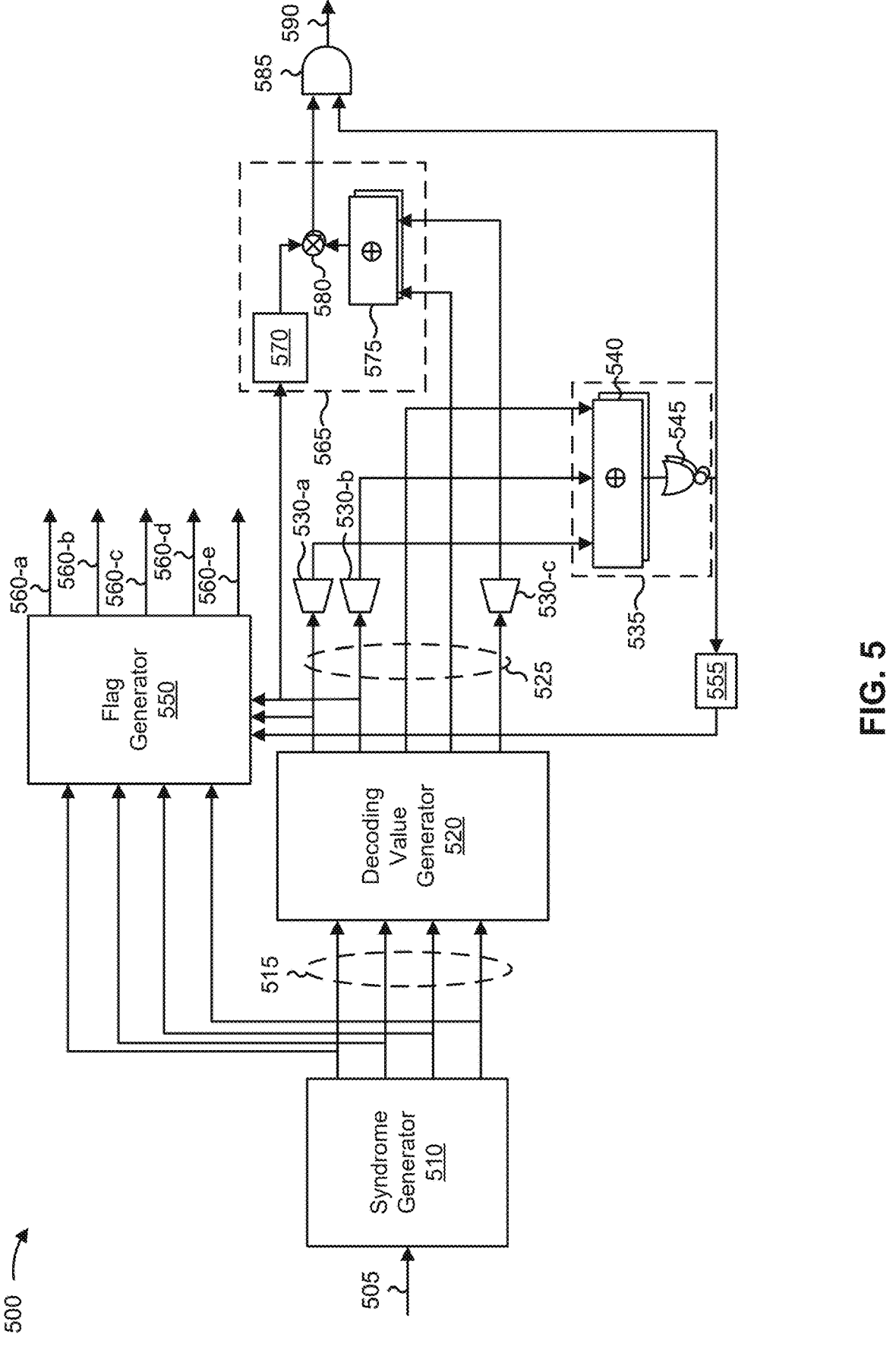
FIG. 5 is a diagram illustrating an example of a system that supports error control in memory systems using combinational circuits.

FIG. 5 is a diagram illustrating an example of a system 500 that supports error control in memory systems using combinational circuits. The system 500 may include aspects of and/or may be implemented by a memory apparatus, such as the memory system 110 and/or a memory device 120. For example, the system 500 may be implemented in a data path of the memory system, such as the read data path 210 of the memory system 110. The system 500 may include one or more components configured to decode a codeword 505. The codeword 505 may be an example of the codeword 230 as described with reference to FIG. 2.

The system 500 may be configured to determine and/or correct multiple errors in the codeword 505. For example, the codeword 505 may be represented as a set (e.g., a vector), denoted as y, of symbols where a symbol at the $i^{th}$ position in the codeword 505 may be denoted as $y_i$. The system 500 may generate an error vector 590, denoted as e, that is a vector of symbols (e.g., symbols representing an error in the codeword 505), where the $i^{th}$ position in the error vector may be denoted as $e_i$. If the system 500 determines that a symbol $y_i$ includes an error, then the element $e_i$ may be equal to an error value associated with the error. Alternatively, if the system 500 does not detect an error in the symbol $y_i$, then the element $e_i$ may be equal to zero (e.g., the zero element of the algebraic field). The system 500 may generate a corrected codeword, denoted as d, by combining the codeword 505 and the error vector 590. For example, the corrected codeword may be calculated by d=y+e. As described herein, an error value $e_i$ is a symbol that, when added to the symbol $y_i$, produces a corrected symbol $d_i$, as described in greater detail elsewhere herein.

The system 500 may include a syndrome generator 510 configured to calculate a syndrome 515 for the codeword 505. The syndrome 515 may include one or more syndrome values $S_1$, $S_2$, $S_3$, and $S_4$ that may be elements of the algebraic field, as described in greater detail in connection to FIG. 6. The syndrome generator 510 may provide the syndrome 515 to a decoding value generator 530.

The decoding value generator 520 may be configured to, using one or more combinational circuits taking the syndrome 515 as a set of inputs, generate one or more decoding values 525 denoted as A, B, C, D, and E, as described in greater detail in connection to FIG. 7. Because the one or more decoding values 525 may be calculated using operations between the one or more syndrome values (e.g., additions and/or multiplications of the one or more syndrome values), each decoding value 525 may be an element of the algebraic field (e.g., each decoding value 525 may be an 8-bit symbol).

The one or more decoding values 525 may indicate information associated with the error vector e. The system 500 may use a first subset of the decoding values 525 to determine one or more positions i of non-zero error values e; in the error vector e, and may use a second subset of the decoding values 525 to determine the error values $e_i$.

The decoding value generator 520 may provide one or more of the decoding values 525 to one or more coefficient generators 530. A coefficient generator 530 may be configured to obtain a decoding value 525 and output one or more coefficients of an error position equation using the decoding value 525. Each coefficient may correspond to a respective position (a respective symbol index) in the codeword 505. For example, as explained in greater detail in connecting to FIG. 8, for i∈{0, 1, 2, . . . 71}, the coefficient generator 530-$a$ may obtain the decoding value A and may output one or more coefficients $A\alpha^{2i}$. The coefficient generator 530-$b$ may obtain the decoding value B and may output one or more coefficients $B\alpha^i$. The coefficient generator 530-$c$ may obtain the decoding value E and may output one or more coefficients $E\alpha^{-i}$.

The decoding value generator 520 and/or the coefficient generators 530 may provide the coefficients $A\alpha^{2i}$ and $B\alpha^i$, as well as the decoding value C, to an error position generator 535. The error position generator 535 may include one or more combinational circuits 540 configured to determine whether one or more symbols of the codeword 505 include an error. In some implementations, the error position generator 535 may include a quantity of combinational circuits 540 equal to the quantity of symbols of the codeword 505.

In such examples, a combinational circuit 540 (e.g., the $i^{th}$ combinational circuit 540) may be configured to determine whether the symbol $y_i$ of the codeword 505 includes an error. For example, the combinational circuit 540 may obtain, as inputs, the coefficients $A\alpha^{2i}$ and $B\alpha^i$, as well as the decoding value C. The combinational circuit 540 may determine whether the inputs satisfy an equation. For example, as described in greater detail in connection to FIG. 7, the combinational circuit 540 may determine whether the equation $A\alpha^{2i}+B\alpha^i+C=0$ is satisfied (e.g., if the sum of the coefficients $A\alpha^{2i}$, $B\alpha^i$, and the decoding value decoding value C is equal to zero). If the inputs satisfy the equation, then the combinational circuit 540 may detect that an error exists in the $i^{th}$ position of the codeword 505. Alternatively, if the inputs do not satisfy the equation, then the combinational circuit 540 may not detect that an error exists in the $i^{th}$ position of the codeword 505.

To determine whether the inputs satisfy the equation, the combinational circuit 540 may include an adding circuit configured to compute the sum of the inputs and provide the result to a logic gate 545, such as a not-or (NOR) gate. If the result is equal to zero, then the logic gate 545 may output a first value (e.g., a logic "1"). Otherwise, the logic gate 545 may output a second value (e.g., a logic "0"). Accordingly, the error position generator 535 may output one or more error position values (e.g., a respective error position value for each combinational circuit 540), where the $i^{th}$ error position value indicates whether the $i^{th}$ symbol of the codeword 505 contains an error.

The error position generator 535 may provide an indication of the quantity of errors in the codeword 505 to a flag generator 550. For example, the error position generator 535 may provide the one or more error position values to a weight circuit 555. The weight circuit 555 may determine the quantity of errors in the codeword 505 (e.g., by summing the one or more error position values), and may provide the quantity to the flag generator 550.

The flag generator 550 may be configured to extract information associated with one or more errors in the codeword 505 using the syndrome 515 (e.g., provided by the syndrome generator 510), the one or more decoding values 525 (e.g., provided by the decoding value generator 520), and/or the quantity of errors in the codeword 505 (e.g., provided by the weight circuit 555). For example, the flag generator 550 may generate one or more flags 560 indicating information associated with the one or more errors. For example, if the flag generator 550 determines that there are no errors in the codeword 505, then the flag generator 550 may set the value of a flag 560-*a* (e.g., set the value to a logic "1") and may reset the values of flags 560-*b* through 560-*e* (e.g., may set the respective values of the flags 560-*b* through 560-*e* to a logic "0"). Alternatively, if the flag generator 550 determines that the codeword 505 includes a correctable error, then the flag generator 550 may set the value of a flag 560-*d*. Additionally, the flag generator 550 may indicate whether the codeword 505 includes one error or two errors by setting the flags 560-*b* or 560-*c*, respectively. If the flag generator 550 determines that the codeword 505 includes an uncorrectable error, then the flag generator 550 may set the value of the flag 560-*c*. The flag generator 550 may provide the flags 560 to a host system 105 and/or a controller, such as the local controller 125 and/or the memory system controller 115.

The decoding value generator 520 and/or the coefficient generators 530 may provide the coefficients $E\alpha^{-i}$, along with the decoding values B and D, to an error value generator 565. In some examples, the error position generator 535 may provide the one or more error position values to the error value generator 565. The error value generator 565 may be configured to determine one or more error values, where an error value et satisfies the equation $Be_i=D+E\alpha^{-i}$, as described in greater detail in connection to FIG. 7. For example, because the algebraic field is finite, the error value generator 565 may test all possible values of e; for each position i indicated by the error position values to determine the one or more error values that satisfy the equation.

Additionally, or alternatively, the error value generator 565 may include a combinational circuit 570, one or more combinational circuits 575, and one or more combinational circuits 580 configured to determine the one or more error values. The combinational circuit 570, along with a given set of the combinational circuits 575 and 580 (e.g., the $i^{th}$ combinational circuits 575 and 580) may be configured to determine the error value e; using the equation $Be_i=D+E\alpha^{-i}$. For example, the $i^{th}$ combinational circuit 575 may compute the sum of D and $E\alpha^i$. Additionally, the combinational circuit 570 may obtain the decoding value B and may determine the inverse of the decoding value B (e.g., $B^{-1}$, the inverse element of B in the algebraic field). The combinational circuit 580 may compute the product $B^{-1}(D+E\alpha^{-i})$ to compute the error value et.

To determine $B^{-1}$, the combinational circuit 570 may calculate $B^{-1}$ using a set of combinational circuits, such as one or more squarer circuits and/or one or more multiplicative circuits, as described in greater detail in connection to FIG. 7. For example, an inverse element $\alpha^{-1}$ of an element a in a Galois field $GF(2^m)$ can be calculated using $\alpha^{-1}=a^2\,a^{2^2}\,a^{2^3}\ldots a^{2^{m-1}}$. Accordingly, if B is an element of a Galois field $GF(2^8)$, then $B^{-1}=B^2B^4\,B^8B^{16}\,B^{32}B^{64}\,B^{128}$, and $B^{-1}$ may be calculated using the one or more squarer circuits and/or the one or more multiplicative circuits.

Additionally, or alternatively, to determine $B^{-1}$, the combinational circuit 570 may use a mapping between one or more elements of the algebraic field and one or more inverse elements of the algebraic field. The mapping may include a table (e.g., a look-up table) which, for each element in the algebraic field, includes an association between the element and the inverse of the element. Thus, the combinational circuit 570 may look up the value B in the mapping to determine $B^{-1}$.

The combinational circuit 580 may provide the error value e; to one or more logic gates 585 (e.g., one or more AND gates). The one or more logic gates 585 may be configured to combine the error values $e_i$ generated by the error value generator 565 to generate the error vector 590, denoted by e. For example, the one or more logic gates 585 may obtain the one or more error position values from the error position generator 535. To generate the $i^{th}$ symbol of the error vector 590, the one or more logic gates 585 may determine whether the $i^{th}$ error position value indicates that the $i^{th}$ symbol of the codeword 505 includes an error. If the one or more logic gates 585 determine that the $i^{th}$ symbol of the codeword 505 includes an error, then the one or more logic gates 585 may output the error value $e_i$ for the $i^{th}$ symbol of the error vector 590. Alternatively, if the one or more logic gates 585 determine that the $i^{th}$ symbol of the codeword 505 does not include an error, then the one or more logic gates 585 may output zero (e.g., the zero element of the algebraic field) for the $i^{th}$ symbol of the error vector 590.

Accordingly, the system 500 may output the error vector 590. To correct the codeword 505, the memory system (e.g., using the system 500 or another component) may add the error vector 590 to the codeword 505. Said another way, the corrected codeword d may be calculated according to d=y+ e.

In some examples, the system 500 may be organized into one or more stages. For example, the system 500 may include a first stage corresponding to the syndrome generator 510, a second stage corresponding to the decoding value generator 520, a third stage corresponding to the coefficient generators 530, a fourth stage corresponding to the error position generator 535, and/or a fifth stage corresponding to the error value generator 565, among other examples. In such examples, each stage may be associated with a respective buffer, such as a volatile memory array 135 that includes a register. The system may temporarily store the output of stage to the respective buffer (e.g., may cache the output to a buffer) to control timing of the system 500. For example, during a first duration, the system 500 may generate the syndrome 515 and may store the syndrome 515 to a first buffer of the first stage. During a second duration subsequent to the first duration, the system 500 may issue the syndrome 515 from the first buffer to the decoding value generator 520. The decoding value generator 520 may generate the decoding values 525 and may store the decoding values 525 to a second buffer of the second stage. During a third duration subsequent to the second duration, the system 500 may issue the decoding values 525 from the second buffer to the coefficient generators 530. The coefficient generators 530 may generate the coefficients and may store the coefficients to a third buffer of the third stage. During a fourth duration subsequent to the third duration, the system 500 may issue the decoding values 525 from the second buffer and/or may issue the coefficients from the third buffer to the error position generator 535. The error position generator 535 may generate the one or more error position values and may store the one or more error position values to a fourth buffer of the fourth stage. During a fifth duration subsequent to the fourth duration, the system 500 may issue the decoding values 525 from the second buffer, may issue the coefficients from the third buffer, and/or may issue the one or more error position values from the fourth buffer to the error value generator 565 The error value generator 565 may generate the one or more error values and may store the one or more error values to a fifth buffer of the fifth stage. By implementing one or more buffers between stages of the system 500, the system 500 may control the timing of generating the corrected codeword, which may allow the system 500 to reduce the rate of power consumption (e.g., by increasing the duration between consecutive stages), which may allow for improved peak-power management.

By decoding a codeword 505, the system 500 may enable the DSC error scheme using one or more combinational circuits. Such an implementation may improve the performance of decoding the codeword 505, such as by reducing the quantity of resources (e.g., processing resources and/or energy resources) used to decode the codeword 505, by increasing the speed at which the system 500 decodes the codeword 505, and reducing the complexity of processing circuitry used to decode the codeword 505.

As indicated above, FIG. 5 is provided as an example. Other examples may differ from what is described with regard to FIG. 5.

Figure 6:
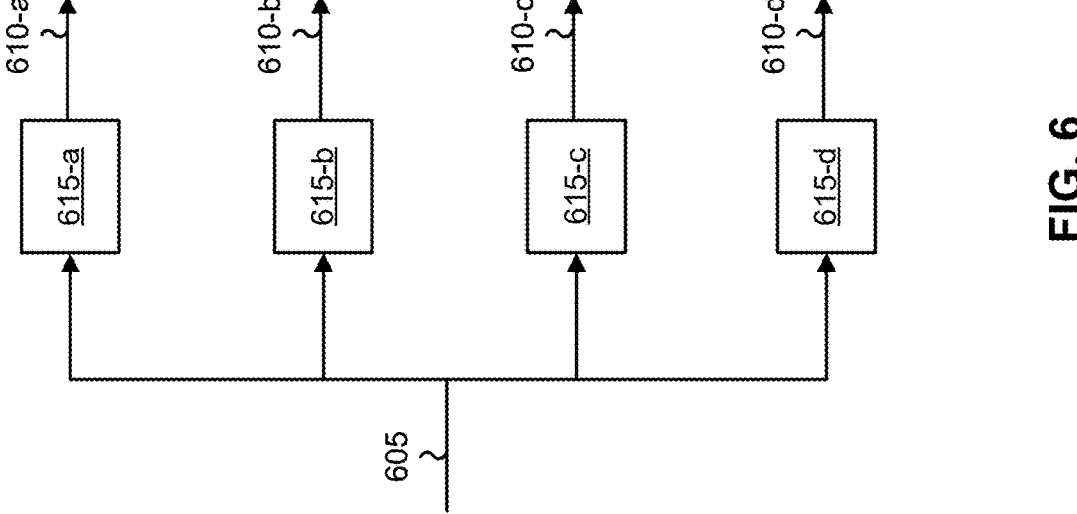
FIG. 6 is a diagram illustrating an example of a system that supports error control in memory systems using combinational circuits.

FIG. 6 is a diagram illustrating an example of a system 600 that supports error control in memory systems using combinational circuits. The system 600 may be an example of a syndrome generator, such as the syndrome generator 510. For example, the system 600 may be implemented within a decoder for a memory system, such as within a decoder 245 of a read data path 210 of the memory system 110.

The system 600 may be configured to obtain a codeword 605, which may be a codeword 505 and may be denoted as y, and generate one or more syndrome values 610 of a syndrome. For example, the system 600 may be configured to generate a syndrome value 610-*a*, denoted by $S_1$, using a combinational circuit 615-*a*, may be configured to generate a syndrome value 610-*b*, denoted by $S_2$, using a combinational circuit 615-*b*, may be configured to generate a syndrome value 610-*c*, denoted by $S_3$, using a combinational circuit 615-*c*, and/or may be configured to generate a syndrome value 610-*d*, denoted by $S_4$, using a combinational circuit 615-*d*.

The system 600 may generate a syndrome value 610 by multiplying (e.g., in accordance with the algebraic field) the codeword 605 by a power of a primitive element of the algebraic field using a combinational circuit 615. For example, the combinational circuit 615-*a* may multiply the codeword 605 by a to obtain $S_1$, the combinational circuit 615-*b* may multiply the codeword 605 by $\alpha^2$ to obtain $S_2$, the combinational circuit 615-*c* may multiply the codeword 605 by $\alpha^3$ to obtain $S_3$, and the combinational circuit 615-*d* may multiply the codeword 605 by $\alpha^4$ to obtain $S_4$, as shown in equations 3 through 6.

$$S_1 = y(\alpha) = \sum_{i=0}^{71} y_i \alpha^i = y \cdot A_1 \tag{3}$$

$$S_2 = y(\alpha^2) = \sum_{i=0}^{71} y_i \alpha^{2i} = y \cdot A_2 \tag{4}$$

$$S_3 = y(\alpha^3) = \sum_{i=0}^{71} y_i \alpha^{3i} = y \cdot A_3 \tag{5}$$

$$S_4 = y(\alpha^4) = \sum_{i=0}^{71} y_i \alpha^{4i} = y \cdot A_4 \tag{6}$$

As shown in equations 3 through 6, each syndrome value 610 may be calculated by multiplying the codeword 605 by a respective vector $A_1$, $A_2$, $A_3$, or $A_4$ defined in table 1.

TABLE 1

$$A_1 = \begin{bmatrix} 1 \\ \alpha \\ \alpha^2 \\ \alpha^3 \\ \alpha^4 \\ \dots \\ \alpha^{71} \end{bmatrix} \quad A_2 = \begin{bmatrix} 1 \\ \alpha^2 \\ \alpha^4 \\ \alpha^6 \\ \alpha^8 \\ \dots \\ \alpha^{142} \end{bmatrix} \quad A_3 = \begin{bmatrix} 1 \\ \alpha^3 \\ \alpha^6 \\ \alpha^9 \\ \alpha^{12} \\ \dots \\ \alpha^{213} \end{bmatrix} \quad A_4 = \begin{bmatrix} 1 \\ \alpha^4 \\ \alpha^8 \\ \alpha^{12} \\ \alpha^{16} \\ \dots \\ \alpha^{284} \end{bmatrix}$$

As indicated above, FIG. 6 is provided as an example. Other examples may differ from what is described with regard to FIG. 6.

Figure 7:
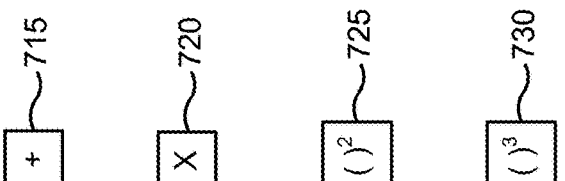
FIG. 7 is a diagram illustrating an example of a system that supports error control in memory systems using combinational circuits.
Figure 7:
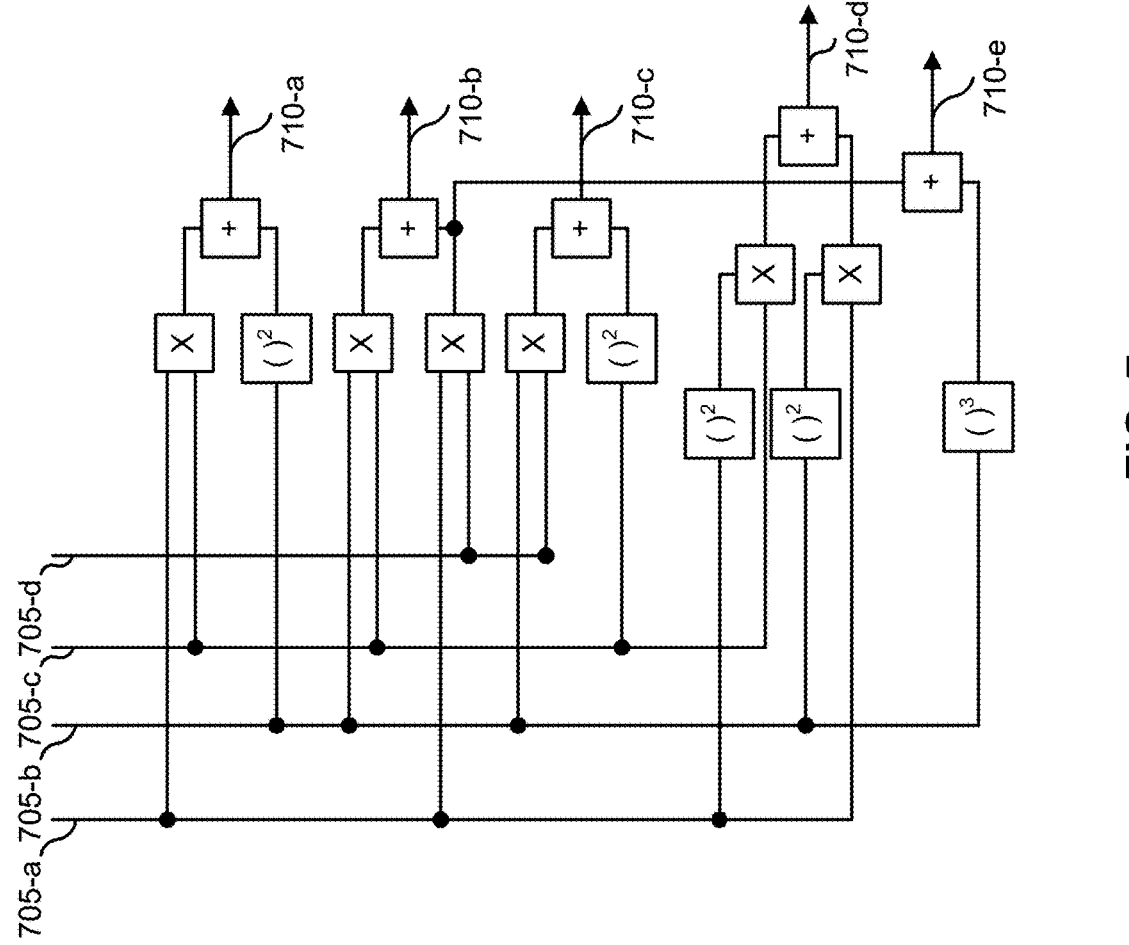

FIG. 7 is a diagram illustrating an example of a system 700 that supports error control in memory systems using combinational circuits. The system 700 may be an example of a decoding value generator, such as the decoding value generator 520. For example, the system 700 may be implemented within a decoder for a memory system, such as within a decoder 245 of a read data path 210 of the memory system 110. The system 700 may be configured to obtain one or more syndrome values 705 (shown as 705-*a*, 705-*b*, 705-*c*, and 705-*d*), which may be the syndrome values 610-*a*, 610-*b*, 610-*c*, and 610-*d* and may be denoted as $S_1$, $S_2$, $S_3$, and $S_4$, respectively, and generate one or more decoding values 710, which may be the one or more decoding values 525.

To generate the decoding values 710, the system 700 may include one or more combinational circuits. For example, the system 700 may include one or more addition circuits 715 configured to obtain two inputs and output the sum of the inputs in accordance with the algebraic field. Additionally, the system 700 may include one or more multiplicator circuits 720 configured to obtain two inputs and output the product of the inputs in accordance with the algebraic field. Additionally, the system 700 may include one or more squarer circuits 725 configured to obtain an input and output the square of the input in accordance with the algebraic field. Additionally, the system 700 may include one or more cubator circuits 730 configured to obtain an input and output the cube of the input in accordance with the algebraic field.

Using the addition circuits 715, the multiplicator circuits 720, the squarer circuits 725, and the cubator circuits 730, the system 700 may generate a decoding value 710-*a*, denoted as A, a decoding value 710-*b*, denoted as B, a decoding value 710-*c*, denoted as C, a decoding value 710-*d*, denoted as D, and a decoding value 710-*e*, denoted as E, as shown in equations 7 through 11.

$$A = S_1 S_3 + S_2^2 \tag{7}$$

$$B = S_2 S_3 + S_1 S_4 \tag{8}$$

$$C = S_3^2 + S_2 S_4 \tag{9}$$

$$D = S_1^2 S_3 + S_1 S_2^2 \tag{10}$$

$$E = S_2^3 + S_1^2 S_4 \tag{11}$$

The one or more combinational circuits may perform respective operations in accordance with the algebraic field. For example, an addition circuit 715 may compute the XOR of the inputs and output the result. The system 700 may perform multiplicative operations as a sum of symbols in terms of the primitive element $\alpha$. For example, equation 12 may illustrate a notation that enables multiplying, using the addition circuit 715, a symbol a having a $j^{th}$ component (e.g., a $j^{th}$ bit) denoted by $\alpha_j$ by a symbol b having a $j^{th}$ component denoted by $b_j$.

$$ab = \left(\sum_{j=0}^{7} a_j \alpha^j\right)b = \sum_{j=0}^{7} a_j\left(b\alpha^j\right) \tag{12}$$

Equation number 13 may illustrate a notation that enables squaring, using the multiplicator circuit 720, a symbol a.

$$a^2 = \left(\sum_{j=0}^{7} a_j\alpha^j\right)^2 = \sum_{j=0}^{7} a_j\alpha^{2j} = a\begin{bmatrix} 1 \\ \alpha^2 \\ \alpha^4 \\ \alpha^6 \\ \alpha^8 \\ \alpha^{10} \\ \alpha^{12} \\ \alpha^{14} \end{bmatrix} \tag{13}$$

Equation number 14 may illustrate a notation that enables cubing, using the squarer circuit 725, a symbol a.

$$a^3 = \left(\sum_{j=0}^{7} a_j\alpha^j\right)^3 = \left(\sum_{j=0}^{7} a_j\alpha^j\right)^2 \sum_{j=0}^{7} a_j\alpha^j = \sum_{j=0}^{7} a_j\alpha^{2j}\sum_{j=0}^{7} a_j\alpha^j = \tag{14}$$

$$\sum_{j=0}^{7} a_j\alpha^j + \sum_{j=0}^{7} a_j\alpha^j = \sum_{j=0}^{7} a_j\alpha^{3j} + \sum_{j=0}^{6}\sum_{k=j+1}^{7} a_j a_k\left(\alpha^{2j+k} + a^{j+2k}\right)$$

The system 700 may provide a first subset of the decoding values 710 to a coefficient generator (e.g., the coefficient generator 530) and/or an error position generator (e.g., the error position generator 535). The first subset may include the decoding value 710-$a$, the decoding value 710-$b$, and the decoding value 710-$c$. The coefficient generator may provide a first one or more coefficients associated with the decoding value 710-$a$ and the decoding value 710-$b$ to the error position generator. The error position generator may identify whether the $i^{th}$ symbol of a codeword (e.g., the codeword 505) includes an error. Additionally, the system 700 may provide a second subset of the decoding values to the coefficient generator and/or an error value generator (e.g., the error value generator 565). The second subset may include the decoding value 710-$b$, the decoding value 710-$d$, and the decoding value 710-$e$. The coefficient generator may provide a second one or more coefficients to the error value generator. The error value generator may generate the error value for the $i^{th}$ symbol of a codeword et.

For example, the errors of the codeword may be described in terms of an error locator polynomial $\Lambda(x)$ that may indicate a position of the errors and an error equation polynomial $\Omega(x)$ that may indicate the value of the errors. The key equations of the error locator polynomial may be written in terms of unknown coefficients $\Lambda_1$ and $\Lambda_2$ of the error locator polynomial, as shown by equations 15 and 16.

$$S_3\Lambda_1 + S_2\Lambda_2 = S_4 \tag{15}$$

$$S_2\Lambda_1 + S_1\Lambda_2 = S_3 \tag{16}$$

If $A\neq0$, then the rank of the key equations 15 and 16 is full, and the codeword includes two errors. In this case, $\Lambda_1$ and $\Lambda_2$ may be written in terms of the syndrome values 705 and A, as shown in equations 17 and 18.

$$\Lambda_1 = \frac{S_2 S_3 + S_1 S_4}{A} \tag{17}$$

$$\Lambda_2 = \frac{S_3^2 + S_2 S_4}{A} \tag{18}$$

Further, the error equation polynomial $\Omega(x)$ may be written in terms of the syndrome values 705 and A, as shown in equation 19.

$$\Omega(x) = S_1 + \frac{S_2^3 + S_1^2 S_4}{A}x = S_1 + (S_2 + S_1\Lambda_1)x \tag{19}$$

Assuming that $x=\alpha^{-i}$, the error value $e_i$ is thus given by equation 20.

$$e_i = \frac{\Omega(x)}{\Lambda'(x)} = \frac{S_1}{\Lambda_1} + \frac{S_2}{\Lambda_1}x + S_1x \tag{20}$$

The error locator polynomial may thus be written in terms of A, B, and C, as shown by equation 21.

$$A\Lambda(x)=A+Bx+Cx^2 \tag{21}$$

Similarly, the equation for the error value $e_i$ may be written in terms of B, D, and E, as shown in equation 22.

$$Be_i=S_1A+(S_2A+S_1B)x=D+Ex \tag{22}$$

Accordingly, if $\Lambda(x)=0$, then equations 23 and 24 are satisfied when there is an error in the $i^{th}$ symbol of the codeword.

$$A\alpha^{2i}+B\alpha^i+C=0 \tag{23}$$

$$e_iB+D+Ea^{-1}=0 \tag{24}$$

Alternatively, if $A=0$, then the rank of the key equations 16 and 17 is not full, and the codeword includes a single error. In this case, $\Lambda_2=0$, and $\Lambda_1$ may be written in terms of the syndrome values 705, as shown in equation 25.

$$\Lambda_1 = \frac{S_2}{S_1} \tag{25}$$

Thus, the error locator polynomial may be written as shown in equation 26.

$$S_1\Lambda(x)=S_1+S_2x \tag{26}$$

Accordingly, the error equation polynomial may be written as shown in equation 27.

$$\Omega(x)=S_1 \tag{27}$$

Further, the equation for the error value $e_i$ may be written as shown in equation 28.

$$e_i = \frac{S_1^2}{S_2} \tag{28}$$

Table 2 may summarize equations 7 through 28 in the case in which the codeword includes two errors (e.g. $A \neq 0$) and in the case in which the codeword includes one error (e.g., $A=0$).

TABLE 2

| Two errors | One error |
|---|---|
| $A = S_1 S_3 + S_2^2 \neq 0$ | $A = 0$ |
| $B = S_2 S_3 + S_1 S_4$ | $B = S_2$ |
| $C = S_3^2 + S_2 S_4$ | $C = S_3$ |
| $D = S_1^2 S_3 + S_1 S_2^2$ | $D = S_1^2$ |
| $E = S_2^3 + S_1^2 S_4$ | $E = 0$ |

$$\Lambda(x) = 1 + \Lambda_1 x + \Lambda_2 x^2$$
$$\Lambda'(x) = \Lambda_1$$
$$\Omega(x) = S_1 + (S_2 + S_1 \Lambda_1)$$

| | |
|---|---|
| $\Lambda_1 = \dfrac{B}{A} \quad \Lambda_2 = \dfrac{C}{A}$ | $\Lambda_1 = \dfrac{S_2}{S_1} = \dfrac{S_3}{S_1} \quad \Lambda_2 = 0$ |
| $\Omega(x) = S_1 + \left(S_2 + \dfrac{S_1 B}{A}\right)x$ | $\Omega(x) = S_1$ |
| $e_i = \dfrac{\Omega(x)}{\Lambda'(x)} = \dfrac{S_1 + (S_2 + S_1 \Lambda_1)x}{\Lambda_1}$ | $e_i = \dfrac{S_1}{\Lambda_1} = \dfrac{S_1^2}{S_2}$ |
| $\Lambda = 0 \Rightarrow A\alpha^{2i} + B\alpha^i + C = 0$ <br> $i \in 0, \ldots, 71$ | $\Lambda = 0 \Rightarrow S_2 \alpha^i + S_3 = 0$ <br> $i \in 0, \ldots, 71$ |
| $Be_i = D + E\alpha^{-i}$ | $S_2 e_i = S_1^2$ |

As indicated above, FIG. 7 is provided as an example. Other examples may differ from what is described with regard to FIG. 7.

Figure 8:
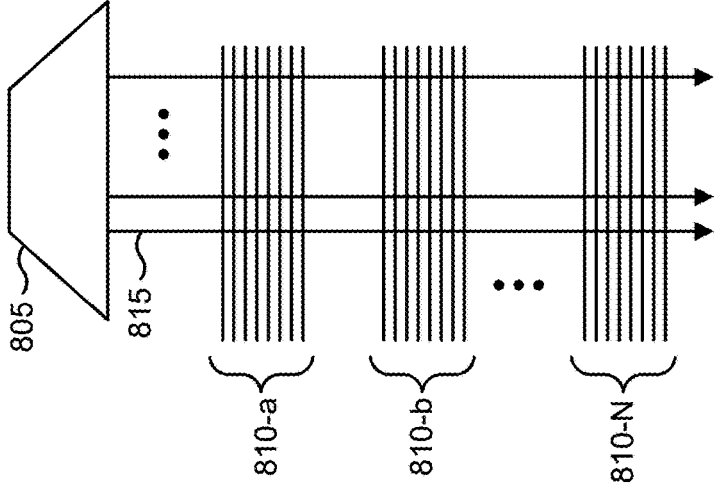
FIG. 8 is a diagram illustrating an example of a system that supports error control in memory systems using combinational circuits.
Figure 8:
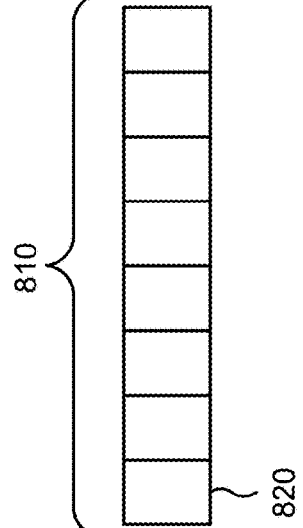

FIG. 8 is a diagram illustrating an example of a system 800 that supports error control in memory systems using combinational circuits. The system 800 may include a coefficient generator 805, which may be a coefficient generator 530. For example, the system 800 may be implemented within a decoder for a memory system, such as within a decoder 245 of a read data path 210 of the memory system 110. The system 800 may be configured to obtain a decoding value and output one or more coefficients 810, such as a coefficient 810-a, a coefficient 810-b, through a coefficient 810-N based on linear combinations 815 of the decoding value.

As described herein, a linear combination 815 of a decoding value may be a single bit equal to the sum (e.g., the XOR) of each bit of the decoding value, where each bit is multiplied by the respective value (e.g., multiplied by one or zero). For example, the kth linear combination 815 ($LC^k$) of the decoder value A, in which $A_j$ may be the $j^{th}$ bit of the decoder value A, may be defined by a vector $a^k$ having values $a^k$ equal to one or zero, as shown in equation 29. Each vector $a^k$ may include a unique sequence of ones and zeros. By way of example, $a^0 = [0, 0, 0, 0, 0, 0, 0, 0]$, $a^1 = [0, 0, 0, 0, 0, 0, 0, 1]$, $a^2 = [0, 0, 0, 0, 0, 0, 1, 0]$, and so on.

$$LC^k = \sum_{j=0}^{7} a_j^k A_j \tag{29}$$

Each vector $a^k$ may include a unique sequence of ones and zeros. By way of example, suppose that $A = [1, 1, 0, 1, 0, 1, 1, 1]$. Further, suppose $a^0 = [0, 0, 0, 0, 0, 0, 0, 0]$, $a^1 = [0, 0, 0, 0, 0, 0, 0, 1]$, $a^2 = [0, 0, 0, 0, 0, 0, 1, 0]$, and so on. In such an example, the linear combination $LC^1$ of A would be given by equation 30.

$$LC^1 = \sum_{j=0}^{7} a_j^1 A_j = 0 \cdot 1 + 0 \cdot 1 + 0 \cdot 0 + 0 \cdot 1 + 0 \cdot 0 + 0 \cdot 1 + 0 \cdot 1 + 1 \cdot 1 = \tag{30}$$
$$0 + 0 + 0 + 0 + 0 + 0 + 0 + 1 = 1$$

Accordingly, if the decoder value A and the vector $a^k$ are eight bit values, then there may be 256 possible linear combinations 815 of the decoder value (e.g., one linear combination for each possible vector $a^k$, where k $\in$ {0, 1, 2, . . . 255}).

A given bit 820 of a coefficient 810 may be equal to a particular linear combination 815 of the decoder value associated with the coefficient 810. Said another way, the $j^{th}$ bit 820 of a coefficient may be equal to a particular linear combination $LC^k$. For example, a first bit 820 of the coefficient $A\alpha^{2i}$ (e.g., $(A\alpha^{2i})$) may be equal to a linear combination $LC^4$, a second bit 820 of the coefficient $A\alpha^{2i}$ (e.g., $(A\alpha^{2i})$) may be equal to a linear combination $LC^{12}$, and so on. Although particular values for $a^k$ are given, such values are merely illustrative. Other choices for $a^k$ may be used to enable the techniques described herein.

A coefficient generator 805 may be configured such that each bit 820 of each coefficient 810 is selected from the linear combinations 815. For example, a first coefficient generator 805 configured to generate the coefficients $A\alpha^{2i}$ (e.g., the coefficient generator 530-a) may select each bit $(A\alpha^{2i})_j$ for each $i \in$ {0, 1, 2 . . . 71} and each $j \in$ {0, 1, 2 . . . 7}. The first coefficient generator 805 may provide the coefficients $A\alpha^{2i}$ to the error position generator 535 (e.g., may provide the $i^{th}$ coefficient $A\alpha^{2i}$ to the $i^{th}$ combinational circuit 540). Similarly, a second coefficient generator 805 configured to generate the coefficients Bai (e.g., the coefficient generator 530-b) may select each bit $(B\alpha^i)_j$ for each $i \in$ {0, 1, 2 . . . 71} and each j $\in$ {0, 1, 2 . . . 7}. The second coefficient generator 805 may provide the coefficients $B\alpha^i$ to the error position generator 535. Additionally, a third coefficient generator 805 configured to generate the coefficients $E\alpha^{-i}$ (e.g., the coefficient generator 530-c) may select each bit $(E\alpha^{-i})$, for each $i \in$ {0, 1, 2 . . . 71} and each $j \in$ {0, 1, 2 . . . 7}. The third coefficient generator 805 may provide the coefficients $E\alpha^{-i}$ to the error value generator 565 (e.g., may provide the $i^{th}$ coefficient $E\alpha^{-i}$ to the $i^{th}$ combinational circuit 575).

As indicated above, FIG. 8 is provided as an example. Other examples may differ from what is described with regard to FIG. 8.

Figure 9:
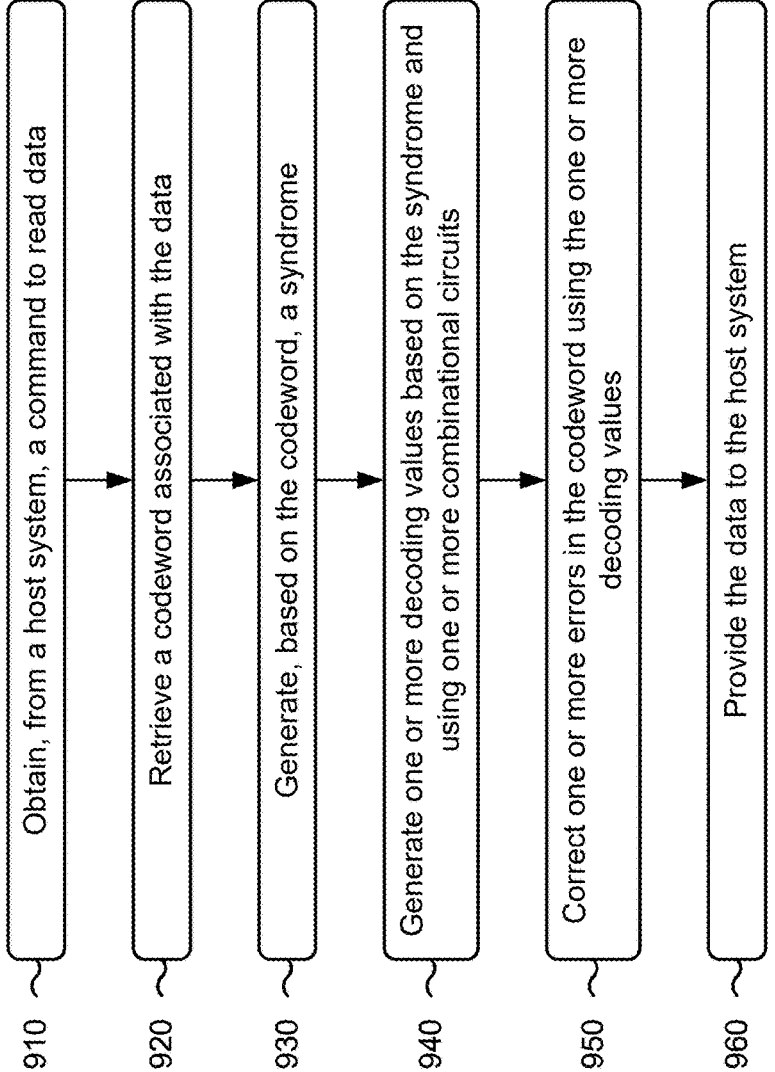
FIG. 9 is a flowchart of an example method associated with error control in memory systems using combinational circuits.

FIG. 9 is a flowchart of an example method 900 associated with error control in memory systems using combinational circuits. In some implementations, a memory system (e.g., the memory system 110) may perform or may be configured to perform the method 900. In some implementations, another device or a group of devices separate from or including the memory system (e.g., the host system 105, the host processor 150, and or the host interface 140) may perform or may be configured to perform the method 900. Additionally, or alternatively, one or more components of the memory system (e.g., a memory system controller 115, one or more memory devices 120, one or more local controllers 125, one or more memory arrays 130, one or more volatile memory arrays 135, a system 200, an encoder 400, a system 500, a system 600, a system 700, and/or a system 800) may perform or may be configured to perform the method 900. Thus, means for performing the method 900 may include the memory system and/or one or more components of the memory system. Additionally, or alternatively, a non-transitory computer-readable medium may store one or more instructions that, when executed by the memory system, cause the memory system to perform the method 900.

As shown in FIG. 9, the method 900 may include obtaining, from a host system, a command to read data (block 910). As further shown in FIG. 9, the method 900 may include retrieving a codeword associated with the data (block 920). As further shown in FIG. 9, the method 900 may include generating, based on the codeword, a syndrome (block 930). As further shown in FIG. 9, the method 900 may include generating one or more decoding values based on the syndrome and using one or more combinational circuits (block 940). As further shown in FIG. 9, the method 900 may include correcting one or more errors in the codeword using the one or more decoding values (block 950). As further shown in FIG. 9, the method 900 may include providing the data to the host system (block 960).

The method 900 may include additional aspects, such as any single aspect or any combination of aspects described below and/or described in connection with one or more other methods or operations described elsewhere herein.

In a first aspect, correcting the one or more errors comprises obtaining, at an error value generator, a subset of the one or more decoding values, generating an error value using the subset of the one or more decoding values, and adding the error value to the codeword to correct the one or more errors.

In a second aspect, alone or in combination with the first aspect, generating the error value comprises calculating, using a second one or more combinational circuits, an inverse of a decoding value of the one or more decoding values.

In a third aspect, alone or in combination with one or more of the first and second aspects, generating the error value comprises identifying, using a mapping between one or more elements of an algebraic field and one or more inverse elements of the algebraic field, an inverse of a decoding value of the one or more decoding values.

In a fourth aspect, alone or in combination with one or more of the first through third aspects, the method 900 includes obtaining, at an error position generator coupled to a decoding value generator, a second subset of the one or more decoding values, generating, using a second one or more combinational circuits of the error position generator, one or more values indicating a position of the error value, and providing the one or more values to the error value generator, where generating the error value is based on the one or more values.

In a fifth aspect, alone or in combination with one or more of the first through fourth aspects, the method 900 includes generating, using one or more coefficient generators, respective sets of coefficients of the second subset of decoding values, where generating the one or more values is based on the respective sets of coefficients.

In a sixth aspect, alone or in combination with one or more of the first through fifth aspects, the method 900 includes generating, at a flag generator coupled to a decoding value generator, one or more values indicating whether the codeword includes the one or more errors.

In a seventh aspect, alone or in combination with one or more of the first through sixth aspects, the method 900 includes obtaining, from the host system, a second command to store the data, generating, at an encoder and using a second one or more combinational circuits, first parity information, where the codeword includes the first parity information and the data, and storing the codeword to one or more memory arrays of the memory system.

In an eighth aspect, alone or in combination with one or more of the first through seventh aspects, the method 900 includes generating, using a CRC operation, second parity information, where the codeword further includes the second parity information.

In a ninth aspect, alone or in combination with one or more of the first through eighth aspects, the method 900 includes storing, at a buffer of the memory system, the syndrome, where generating the one or more decoding values comprises obtaining the syndrome from the buffer.

In a tenth aspect, alone or in combination with one or more of the first through ninth aspects, the method 900 includes storing, at a buffer of the memory system, the one or more decoding values, where correcting the one or more errors comprises obtaining the one or more decoding values from the buffer.

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein.

In some implementations, a memory apparatus includes: a syndrome generator configured to generate a syndrome based on a codeword; a decoding value generator coupled to the syndrome generator, the decoding value generator configured to generate one or more decoding values based on the syndrome and using one or more combinational circuits; and an error value generator configured to generate an error value associated with the codeword based on the one or more decoding values.

In some implementations, a method includes: obtaining, by a memory system and from a host system, a command to read data; retrieving, by the memory system, a codeword associated with the data; generating, by the memory system and based on the codeword, a syndrome; generating, by the memory system, one or more decoding values based on the syndrome and using one or more combinational circuits; correcting, by the memory system, one or more errors in the codeword using the one or more decoding values; and providing the data to the host system.

In some implementations, a memory apparatus includes one or more controllers configured to: obtain, from a host system, a command to read data; retrieve a codeword associated with the data; generate, at a syndrome generator of the memory apparatus and based on the codeword, a syndrome; generate, at a decoding value generator of the memory apparatus, one or more decoding values based on the syndrome and using one or more combinational circuits; correct one or more errors in the codeword using the one or more decoding values; and provide the data to the host system.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory apparatus, comprising:
a syndrome generator configured to generate a syndrome based on a codeword;
a decoding value generator coupled to the syndrome generator, the decoding value generator configured to generate one or more decoding values based on the syndrome and using one or more combinational circuits; and
an error value generator configured to generate an error value associated with the codeword based on the one or more decoding values,
wherein, to generate the error value, the error value generator is configured to identify, using a mapping between one or more elements of an algebraic field and one or more inverse elements of the algebraic field, an inverse of a decoding value of the one or more decoding values.

2. The memory apparatus of claim 1,
wherein each combinational circuit of the one or more combinational circuits is configured to obtain a respective subset of one or more syndrome values of the syndrome and configured to output a respective decoding value of the one or more decoding values.

3. The memory apparatus of claim 1, further comprising:
an error position generator coupled to the decoding value generator, the error position generator configured to obtain a subset of the one or more decoding values and generate, using a second one or more combinational circuits, one or more values indicating a position of the error value.

4. The memory apparatus of claim 3, further comprising:
a flag generator coupled to the syndrome generator, the decoding value generator, and the error position generator, wherein the flag generator is configured to identify whether the codeword includes one or more errors.

5. The memory apparatus of claim 3, further comprising:
one or more coefficient generators coupled to the decoding value generator, each coefficient generator configured to obtain a respective decoding value of the one or more decoding values and provide a respective set of coefficients of the respective decoding value to the error position generator.

6. The memory apparatus of claim 1, further comprising:
an encoder configured to generate the codeword using a second one or more combinational circuits and data associated with a write command, wherein the codeword includes the data.

7. The memory apparatus of claim 1, wherein, to generate the error value, the error value generator is configured to:
calculate, using a second one or more combinational circuits, the inverse of the decoding value of the one or more decoding values.

8. A method, comprising:
obtaining, by a memory system and from a host system, a command to read data;
retrieving, by the memory system, a codeword associated with the data;
generating, by the memory system and based on the codeword, a syndrome;
generating, by the memory system, one or more decoding values based on the syndrome and using one or more combinational circuits;
correcting, by the memory system, one or more errors in the codeword using the one or more decoding values,
wherein correcting the one or more errors comprises identifying, using a mapping between one or more elements of an algebraic field and one or more inverse elements of the algebraic field, an inverse of a decoding value of the one or more decoding values; and providing the data to the host system.

9. The method of claim 8, wherein correcting the one or more errors further comprises:

obtaining, at an error value generator, a subset of the one or more decoding values;

generating an error value using the subset of the one or more decoding values; and adding the error value to the codeword to correct the one or more errors.

10. The method of claim 9, wherein generating the error value comprises:

calculating, using a second one or more combinational circuits, the inverse of the decoding value.

11. The method of claim 8, further comprising:

generating, at a flag generator coupled to a decoding value generator, one or more values indicating whether the codeword includes the one or more errors.

12. The method of claim 8, further comprising:

obtaining, from the host system, a second command to store the data;

generating, at an encoder and using a second one or more combinational circuits, first parity information, wherein the codeword includes the first parity information and the data; and storing the codeword to one or more memory arrays of the memory system.

13. The method of claim 12, further comprising:

generating, using a cyclic redundancy check (CRC) operation, second parity information, wherein the codeword further includes the second parity information.

14. The method of claim 8, further comprising:

storing, at a buffer of the memory system, the syndrome, wherein generating the one or more decoding values comprises obtaining the syndrome from the buffer.

15. The method of claim 8, further comprising:

storing, at a buffer of the memory system, the one or more decoding values, wherein correcting the one or more errors comprises obtaining the one or more decoding values from the buffer.

16. A method, further comprising:

obtaining, by a memory system and from a host system, a command to read data;

generating, by the memory system and using one or more combinational circuits, one or more decoding values based on a syndrome associated with a codeword that is associated with the data;

obtaining, at an error position generator coupled to a decoding value generator, a first subset of the one or more decoding values;

generating, using a second one or more combinational circuits of the error position generator, one or more values indicating a position of an error value;

providing the one or more values to an error value generator;

generating, at the error value generator, the error value using a second subset of the one or more decoding values;

adding, by the memory system, the error value to the codeword to correct one or more errors in the codeword; and providing the data to the host system.

17. The method of claim 16, further comprising:

generating, using one or more coefficient generators, respective sets of coefficients of the second subset of decoding values, wherein generating the one or more values is based on the respective sets of coefficients.

18. The method of claim 16, wherein generating the error value further comprises:

calculating, using a third one or more combinational circuits, an inverse of a decoding value of the one or more decoding values.

19. The method of claim 16, further comprising:

generating, at a flag generator coupled to the decoding value generator, one or more values indicating whether the codeword includes the one or more errors.

20. The method of claim 16, further comprising:

obtaining, from the host system, a second command to store the data;

generating, at an encoder and using a third one or more combinational circuits, first parity information, wherein the codeword includes the first parity information and the data; and storing the codeword to one or more memory arrays of the memory system.

21. A memory apparatus, comprising:

one or more controllers configured to:

obtain, from a host system, a command to read data;

retrieve a codeword associated with the data;

generate, at a syndrome generator of the memory apparatus and based on the codeword, a syndrome;

generate, at a decoding value generator of the memory apparatus, one or more decoding values based on the syndrome and using one or more combinational circuits;

correct one or more errors in the codeword using the one or more decoding values, wherein, to correct the one or more errors, the one or more controllers are configured to identify, using a mapping between one or more elements of an algebraic field and one or more inverse elements of the algebraic field, an inverse of a decoding value of the one or more decoding values; and provide the data to the host system.

22. The memory apparatus of claim 21, wherein, to correct the one or more errors, the one or more controllers are further configured to:

obtain, at an error value generator, a subset of the one or more decoding values;

generate an error value using the subset of the one or more decoding values; and add the error value to the codeword to correct the one or more errors.

23. The memory apparatus of claim 22, wherein, to generate the error value, the one or more controllers are further configured to:

calculate, using a second one or more combinational circuits, an inverse of a decoding value of the one or more decoding values.

24. The memory apparatus of claim 22, wherein the one or more controllers are further configured to:

obtain, at an error position generator coupled to the decoding value generator, a second subset of the one or more decoding values;

generate, using a second one or more combinational circuits of the error position generator, one or more values indicating a position of the error value; and provide the one or more values to the error value generator, wherein generating the error value is based on the one or more values.

25. The memory apparatus of claim 24, wherein the one or more controllers are further configured to:

generate, using one or more coefficient generators, respective sets of coefficients of the second subset of decoding values, wherein generating the one or more values is based on the respective sets of coefficients.

\* \* \* \* \*